(12) United States Patent
James et al.

(10) Patent No.: US 6,876,558 B1
(45) Date of Patent: Apr. 5, 2005

(54) METHOD AND APPARATUS FOR IDENTIFYING CONTENT ADDRESSABLE MEMORY DEVICE RESULTS FOR MULTIPLE REQUESTING SOURCES

(75) Inventors: David V. James, Palo Alto, CA (US); Jagadeesan Rajamanickam, San Jose, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 175 days.

(21) Appl. No.: 10/264,883

(22) Filed: Oct. 4, 2002

Related U.S. Application Data
(60) Provisional application No. 60/343,973, filed on Dec. 27, 2001.

(51) Int. Cl.[7] .............................................. G11C 15/00
(52) U.S. Cl. ................ 365/49; 365/189.06; 365/189.07; 365/189.12; 711/108
(58) Field of Search ........................... 365/49, 189.06, 365/189.07, 189.12, 189.02, 189.04; 711/108; 370/392

(56) References Cited

U.S. PATENT DOCUMENTS

| | | | |
|---|---|---|---|
| 5,506,992 A | 4/1996 | Saxenmeyer | |
| 5,566,170 A | * 10/1996 | Bakke et al. | ................ 370/392 |
| 5,781,769 A | 7/1998 | Weber | |
| 5,930,359 A | 7/1999 | Kempke et al. | |
| 5,963,972 A | 10/1999 | Calder et al. | |
| 6,233,242 B1 | 5/2001 | Mayer et al. | |
| 6,256,313 B1 | 7/2001 | Chung | |
| 6,275,861 B1 | 8/2001 | Chaudri et al. | |
| 6,700,809 B1 | * 3/2004 | Ng et al. | ........................ 365/49 |

OTHER PUBLICATIONS

"IEEE Standard for Scalable Coherent Interface (SCI)", *IEEE Std 1596–1992*, Institute of Electrical and Electronic Engineers, Inc., New York, NY, pp. 4–25 and 47–72, May 23, 2001.

* cited by examiner

*Primary Examiner*—Anh Phung
*Assistant Examiner*—Pho M. Luu
(74) *Attorney, Agent, or Firm*—Bradley T. Sako (57) ABSTRACT

A system (100) may include a content addressable memory (CAM) device (102) and at least two requesting devices (104-0 and 104-n). Requesting devices (104-0 and 104-n) and a CAM device (102) may be connected by at least two communication links (106-0 and 106-n). A CAM device (102) may generate responses to requests, and assign a flow identification value for responses based on a communication link (106-0 and 106-n) on which a corresponding request was received.

20 Claims, 7 Drawing Sheets

METHOD AND APPARATUS FOR IDENTIFYING CONTENT ADDRESSABLE MEMORY DEVICE RESULTS FOR MULTIPLE REQUESTING SOURCES

This application claims the benefit of 60/343,973 filed Dec. 27, 2001.

TECHNICAL FIELD

The present invention relates to content addressable memory (CAM) devices, and more particularly to systems that receive requests for CAM devices from different sources.

BACKGROUND OF THE INVENTION

Many conventional search engine systems typically include one or more search engine devices. A search engine device can include circuitry for performing one or more types of search operations. In a search operation, a comparand (or key) may be compared to multiple entries to see if all or a portion of the key matches an entry. After a search operation, a search engine may give a search result as an output. Typically, a search result may include associated data, or an "index" value that may be used to access associated data.

Search engine devices may take a variety of forms. As but a few of the possible examples, some search engine devices are based on particular types of content addressable memory (CAM) cells. Such CAM cells may include storage circuits integrated with compare circuits. Such storage circuits may be static random access memory (SRAM) type cells or dynamic random access memory (DRAM) type cells, for example. Alternate approaches to search engine devices may include random access memories (RAM) arrays, or the like, with separate matching circuits and/or processes.

Figure 8:
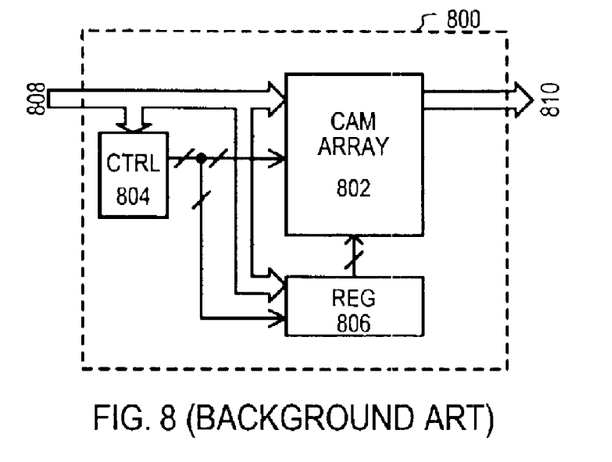
FIG. 8 is a block diagram of a conventional CAM device.

Referring now to FIG. 8, a conventional CAM device 800 will be described in more detail. A conventional CAM device 800 may include a CAM array 802, CAM control circuits 804, and CAM register 806.

A CAM array 802 may have a number of entries for storing data values for comparison with a key value. Each entry may include a number of CAM cells. Data may be written to and/or read from entries. In particular embodiments, a key may be compared against multiple data values stored in such entries. If a data value in a CAM entry matches a key, a search hit (match or multiple match) may be indicated. Otherwise a search miss may be indicated. Search hits can be used to generate index values.

A CAM control circuit 804 can take CAM control signals as inputs and generate signals that may control the operation of a CAM array 802 and/or registers 806. Registers 806 can include a number of storage locations that may store key and other values used for search and other operations.

Having described an example of a CAM device, a conventional CAM search operation will now be described. To perform a search operation, a device such as a network processing unit (NPU), may provide a search command to a CAM device 800 on a data/control bus 808. Such a command may include a key value that can be compared to all or a portion of CAM entries within a CAM array 802. In some approaches, a key value may then be stored in registers 806.

A CAM array 802 may generate a result according to a comparison between a key and entries. Results may take various forms, including match results and/or miss results. If a key matches one CAM entry, a single match result may be generated. If a key matches more than one CAM entry, a multiple match result may be generated. If a key does not match any entries, a miss result may be generated. Results may be provided on a result bus 810. A single match result may take various forms. Typically, a single match result may be an index value that points to associated data, or actual associated data itself. Multiple match and/or miss results may be indicated by particular output flags, or the like.

Figure 9:
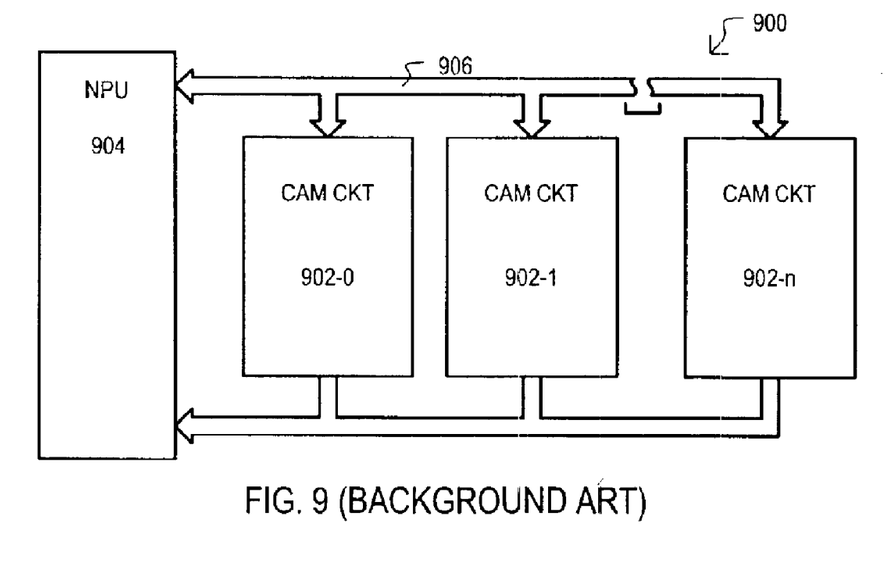
FIG. 9 is a block diagram of a conventional search engine system having a cascaded CAM devices.

A conventional search engine system that can include conventional CAM devices, such as that shown in FIG. 8, is shown in FIG. 9 and designated by the general reference character 900. In the example of FIG. 9, a search engine system 900 includes "n+1" CAM devices, shown as 902-0 to 902-n. A search engine system 900 may perform search operations in response to commands from a requesting device. In FIG. 9, a requesting device is an NPU 904.

FIG. 9 shows an example of a bus based search engine system. In a bus based search engine system, CAM devices may be commonly connected to a requesting device and to one another by a common bus. Thus, in FIG. 9 CAM devices (902-0 to 902-n) can be commonly connected to each other and to an NPU 904 by a bus 906.

In conventional bus based search engine systems, each CAM device may simultaneously compare a key with entries of its respective CAM array. If a CAM device has a match, the CAM device may forward a match indication (e.g., a flag or the like) to a next, lower priority CAM device. A higher priority CAM device may output a result and a lower priority CAM device can be disabled from outputting data to the common output bus. If, however, a higher priority CAM device does not have a match, such a device may not assert a match indication, and a lower priority CAM device can provide an output result.

A drawback to conventional systems can be limitations in scalability, particularly at a requesting end. That is, conventional approaches may typically include a single requesting device for a given set of CAM devices. In the event an additional requesting device is to be added, some sort of labeling within communications can be employed.

As but one example, in other conventional non-CAM approaches, such as those following Scalable Coherent Interface (SCI), IEEE Standard 1596 or SerialBus IEEE Standard 1394, can dictate that requesting devices issue request packets that can include labels and addresses within request packets. Such labels and/or addresses, referred to herein as stream identifiers, can enable a response to be returned to the appropriate requesting device.

A drawback to conventional approaches that include stream identifiers can be added complexity in a system. Such a system can typically include some sort of mechanism for inserting stream identifiers into request packets. In addition, such a system can typically include some sort of unique-address assignment protocol that determines what stream identifier information is inserted into request packets.

Of course, it is always a goal to increase the efficiency of data transmission in a system. In particular, it is desirable to reduce the amount of "overhead" in a packet. That is, reduce the amount of data that is not payload data in a packet.

SUMMARY OF INVENTION

The present invention may include a content addressable memory (CAM) device that includes one or more CAM arrays, each of which may include a number of CAM entries. A CAM device may also include a flow identification (ID) generating circuit that generates a flow ID value for a response, where a response can result from a corresponding request. Each flow ID value can be based on an input from which the corresponding request is received.

According to one aspect of the embodiments, a CAM device may also include a number of input communication links. Each input communication link can receive requests from a different requesting source.

According to another aspect of the embodiments, a CAM device can also include a multiplexer that inputs a request from one of a plurality of input communication links. In particular arrangements, such a multiplexer can input a request according to control signals that correspond to flow ID values.

According to another aspect of the embodiments, a CAM device can include a de-multiplexer that outputs a response on one of a plurality of communication links according to a flow ID value for such a response.

According to another aspect of the embodiments, a CAM device may also include a scheduler that generates control signals for inputting request data on one of a plurality of inputs. Each flow ID value can be generated in response to such control signals.

According to another aspect of the embodiments, a CAM device may also include two or more first-in-first-out buffer circuits (FIFO). Each FIFO can receive requests from a different request source and provide status data corresponding to the amount of data in the FIFO. Such status data can be provided to a scheduler.

The present invention may also include a content addressable memory (CAM) device having at least one CAM array and a de-multiplexer. A de-multiplexer can output a response on one of a number of output communication links according to at least one flow ID value associated with a response.

According to one aspect of the embodiments, a CAM device may also include a flow ID value generating circuit that generates flow ID values for responses based on an input communication link on which a corresponding request is received.

According to another aspect of the embodiments, a CAM device may also include a select multiplexer having one input coupled to an input data path and another input coupled to the CAM array. In one arrangement, an output store can be connected to an output of a select multiplexer. An output store can store a flow ID value and response.

According to another aspect of the embodiments, a CAM device may also include an intermediate store for storing flow ID value. Such an intermediate store can be connected to an input of a select multiplexer.

According to another aspect of the embodiments, a CAM device can also include a number of first-in-first-out buffer circuits (FIFO). Each FIFO can be coupled between an output of a de-multiplexer and output communication links.

According to another aspect of the embodiments, a CAM device can also include an input multiplexer that provides a data path between one of a number of input communication links and a first data path. Such an input multiplexer may operate according to control signals.

The present invention may also include a method of executing requests in a CAM system. Such a method may include the steps of receiving requests from multiple different sources on input communication links and assigning a flow identification value for a response. Such a response can correspond to a request. Further, a flow identification value for such a response can be based an input communication link on which a request was received.

According to one aspect of the embodiments, a method may also include generating responses corresponding to the requests within at least one CAM device.

According to another aspect of the embodiments, requests can be selected from the group consisting of search operations, read operations, write operations, learn operations, and parity check operations.

According to another aspect of the embodiments, a method can also include storing a flow ID value. Such a flow ID value may then be output with response data to an output store.

According to another aspect of the embodiments, a method can also include storing a flow ID value in a first portion of an output store. Subsequently, response data may be output to a second portion of the output store.

The present invention may also include a content addressable memory (CAM) that includes one or more communication links. Such a CAM can be configured to include flow information to an incoming command corresponding to the link on which the command was received.

DETAILED DESCRIPTION OF THE EMBODIMENTS

Various embodiments of the present invention will now be discussed in conjunction with a number of figures. The embodiments set forth devices and methods that can generate a flow identification value for a response based on a link that receives a corresponding request.

Figure 1:
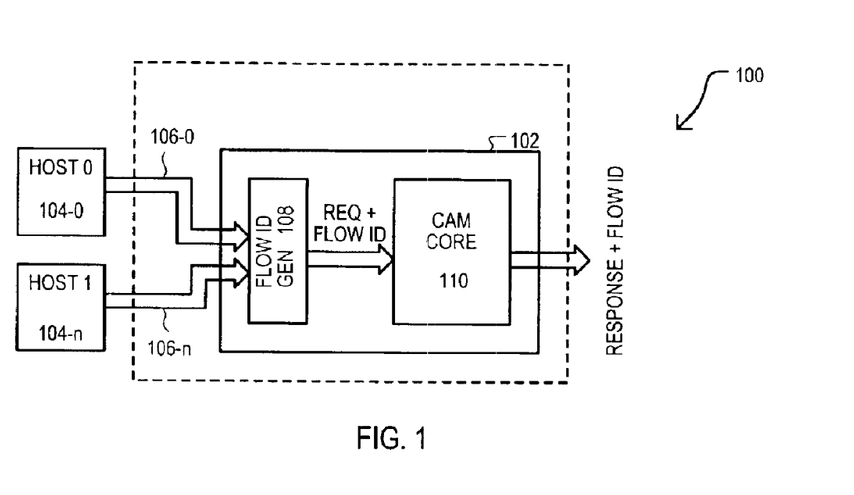
FIG. 1 is a block diagram of a system according to one embodiment of the present invention.

Referring now to FIG. 1, a system according to one embodiment is set forth and designated by the general reference number 100. A system according to one embodiment 100 may include a content addressable memory (CAM) device 102, at least two requesting devices 104-0 and 104-n, and at least two communication links 106-0 and 106-n.

Requesting devices 104-0 and 104-n can issue requests to a CAM device 102 by way of communication links 106-0 and 106-n, respectively. As but one example, a requesting device 104 may be a network processing unit (NPU). A request may include information for executing one or more operations or commands in a CAM device 102. A request may be in packet form and include a number of predetermined data fields. Various particular request formations will be described in more detail in FIGS 4A–4B.

CAM operations or commands that may be indicated in a request may include, without limitation, search operations that compare a key against entry values; write operations that write data to a CAM entry or register; read operations that read data from a CAM entry or CAM register; "learn" operations that can write a key value into a particular CAM entry location; and parity check operations that may check the parity of all or a portion of a CAM entry or CAM register with a corresponding parity bit.

Communication links may include signal lines for transmitting binary data. Preferably, such signal lines may be point-to-point signal lines.

A CAM device 102 may receive a request from a communication link (106-0 or 106-n). In response to a request, a CAM device 102 may generate a corresponding response. In addition, a CAM device 102 may generate a flow identification (ID) value for such a response. A flow ID value can be based upon which particular link a corresponding request was received. In one particular approach, a CAM device 102 may then output a response with a corresponding flow ID value.

In the particular system of FIG. 1, a CAM device 102 may include a flow ID generating circuit 108 and a CAM "core" 110. A flow ID generating circuit 108 may generate a flow identification value for a response according to a source of a request. For example, a source may be a communication link (106-0 or 106-n). A CAM core 110 may include circuits for executing received requests. In response to a request, a CAM core 110 can execute a predetermined operation to generate a response.

While a response may take various forms, a response may preferably be in packet form. In particular, a response may be a data packet that includes a number of fields, one of which can include a flow ID value. It is understood, however, that packet data do not necessarily imply any particular transmission protocol, and may preferably be transmitted according to a unique protocol. Such packet data may include a separation mechanism (e.g., idle codes, predetermined signals, etc.) that may distinguish one packet from the next.

In particular embodiments, a system 100 may be a search engine system including a number of cascaded CAM devices (such as 102). Requests may propagate from a first CAM device to subsequent CAM devices. A response from a first CAM device may have a flow ID value inserted therein. Such a response may then propagate through subsequent CAM devices in the cascade with such a flow ID value.

Having described a system that may receive a request and generate a corresponding response with a flow ID value, an example of a method for assigning a flow ID value according to an embodiment will now be described with reference to FIG. 2.

Figure 2:
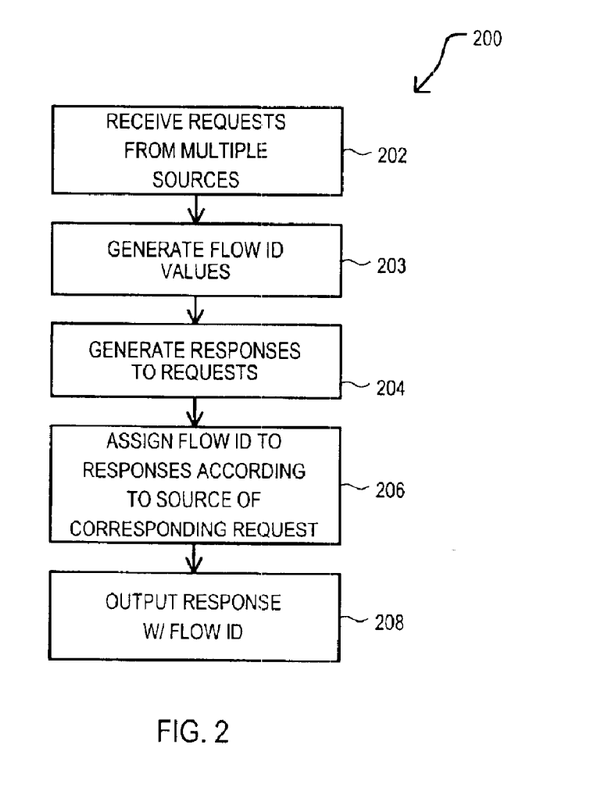
FIG. 2 is a flow diagram of a method of assigning flow identification values according to one embodiment of the present invention.

Referring now to FIG. 2, a method of assigning flow ID values according to one embodiment of the present invention is set forth and designated by the general reference number 200. A method 200 may include receiving requests from two or more different sources (step 202). Flow ID values may then be generated for such different sources (step 203). Responses corresponding to such requests can be generated (step 204). In addition, a flow ID value can be assigned to responses based on a source of a corresponding request (step 206). A response may then be output with a flow ID value (step 208).

A step 202 may include a requesting device generating a request. In particular embodiments, a requesting device may be a network processing unit (NPU). Requests may be transmitted by way of a number of communication links that connect a requesting device to a CAM device.

A step 203 may include a CAM device determining that data is being received on a communication link, and assigning a different flow identification value for data received on each different communication link.

A step 204 may include a CAM device determining a type of request. As but one example, a CAM device may decode a command field in a request packet. Upon determining a request type, a CAM device may execute predetermined CAM device functions to generate a result. For example, in response to a search request, a CAM device can generate a request with a search result, such as a match (e.g., a search key matches a CAM entry), a multiple match (e.g., a search key matches two or more CAM entries), or a miss (no entries match a search key). Such a search result can also include an index value and/or associated data. In response to a write request, a CAM device can generate a response that indicates if data has been successfully written to an indicated entry or register in a CAM. In response to a read request, a CAM device can generate a response that includes read data or indicates a failure for such a request. In response to a learn request, a CAM device can generate a response that indicates which entry a search key value has been written to, or indicate a failure of such an operation. In response to a parity check request, a CAM device can generate a response that indicates if any checked entries passed or failed parity comparison.

Of course the above are but limited descriptions of how such operations or commands may be executed by a CAM device.

A step 206 can include a CAM device determining a source of a request, generating a flow ID value for such a source, and then associating the flow ID value with a resulting response. A step 206 may include, for example, a CAM device generating a flow ID value based on which communication link a request is received. More particularly, a CAM device can detect when a request packet is received on a communication link, generate a flow ID value, and then store such a flow ID value in a storage circuit, or the like.

A step 208 can include transmitting a response value along with a corresponding flow ID value on output signal lines. In one particular approach, a step 208 may include storing response values and flow ID values in an output store, and then transmitting such values as a response packet.

Unlike a conventional approach, a response may be returned to a requesting device issuing a request according to a flow ID value. A flow ID value may be generated by a CAM device rather than included in a request packet issued from a requesting device. This can reduce the complexity of a system, as a requesting device procedure for determining a label or the like may not be included. Further, an output response from such a system may not include a label or the like, thus reducing end result packet size.

Figure 3A:
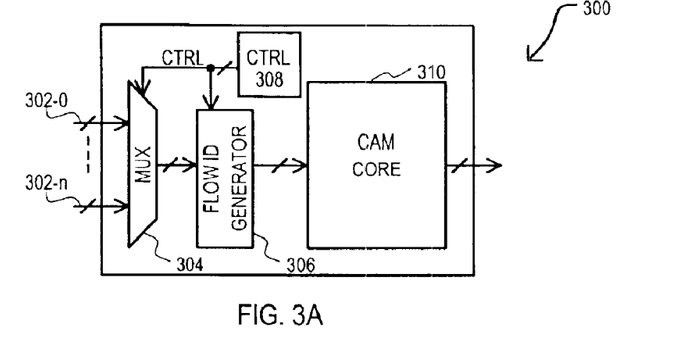
FIG. 3A is a block diagram of an "ingress" content addressable memory (CAM) device according to one embodiment of the present invention.

Referring now to FIG. 3A, an "ingress" CAM device according to one embodiment of the present invention is set forth and designated by the general reference number 300. An "ingress" CAM device 300 may include a number of input connections 302-0 to 302-n, a multiplexer (MUX) 304, a flow ID generating circuit 306, a control circuit 308, and a CAM core 310.

Input connections 302-0 to 302-n may receive requests from communication links. In one arrangement, each input connection (302-0 to 302-n) may receive requests from a different device or process (e.g., thread). As but a few examples, in a search engine arrangement, one or more input connections may receive search related requests from a search component of a system. Alternatively, at least one input connection may receive search related requests from a search component while another different input connection receives update requests from an update component.

A multiplexer MUX 304 may input data from a selected input connection (302-0 to 302-n) according to predetermined criteria. For example, such criteria may include a timing value and/or a traffic value. A timing value may establish a division multiplexing between input connections (302-0 to 302-n). A traffic value may measure a number of requests and/or rate of received requests for input connections (302-0 to 302-n). Once a selected criterion is satisfied, control signals CTRL may enable a MUX 304 to select an input connection (302-0 to 302-n).

A flow ID generating circuit 306 may generate a flow ID value in response to a request input from a MUX 304. In one very particular approach, a flow ID generating circuit 306 may generate a flow ID based on control signals CTRL that select an input connection (302-0 to 302-n).

In this way, a request and a corresponding flow ID value may be supplied to a CAM core 310. A CAM core 310 can operate in the same general fashion as CAM core 110 set forth in FIG. 1.

In this way, an ingress CAM device may generate flow ID values corresponding to a selected input connection.

Figure 3B:
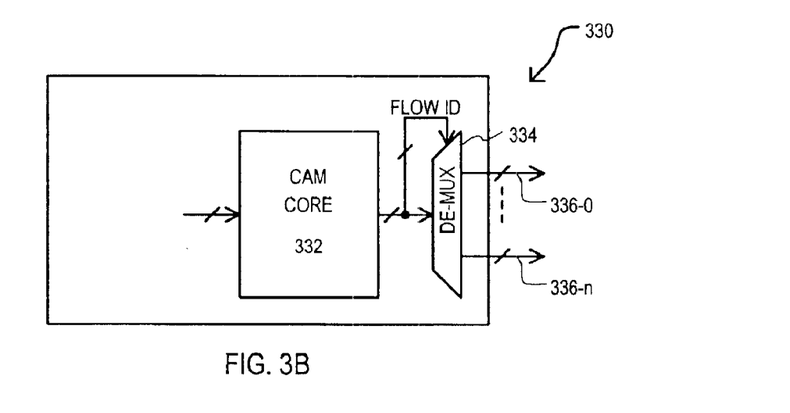
FIG. 3B is a block diagram of an "egress" CAM device according to one embodiment of the present invention.

Referring now to FIG. 3B, an "egress" CAM device according to one embodiment is set forth and designated by the general reference number 330. An "egress" CAM device according to one embodiment 330 may include a CAM core 332, a de-multiplexer circuit (DE-MUX) 334, and a number of output connections 336-0 to 336-n.

A CAM core 332 can generate response data from a received request. A CAM core 332 can associate a flow ID with a response according to an input connection upon which a corresponding request was received. In one particular approach, a CAM core 332 can include a number of CAM entries, each of which may contain a data value for comparisons with a key value (i.e., a comparand). While CAM entries may take various forms, such entries may preferably include a number of CAM cells, or the like, arranged into one or more arrays. A CAM array may store data values in rows, or the like, for comparison with a key value of a received request. A CAM core 332 may also include control registers for configuring the operation of a CAM and/or for storing values associated with particular CAM operations. In addition or alternatively, a CAM core 332 may include data paths that can allow a flow ID value to be received and output from a CAM core 332, or storage circuits for first storing and then outputting a received flow ID value.

A DE-MUX 334 may output a response on one or more output connections 336-0 to 336-n according to a flow ID value. Thus, in the arrangement of FIG. 3B, response data can be output on output connections 336-0 to 336-n according to a flow ID value, instead of with a stream identifier, as may occur in conventional approaches.

Figure 3C:
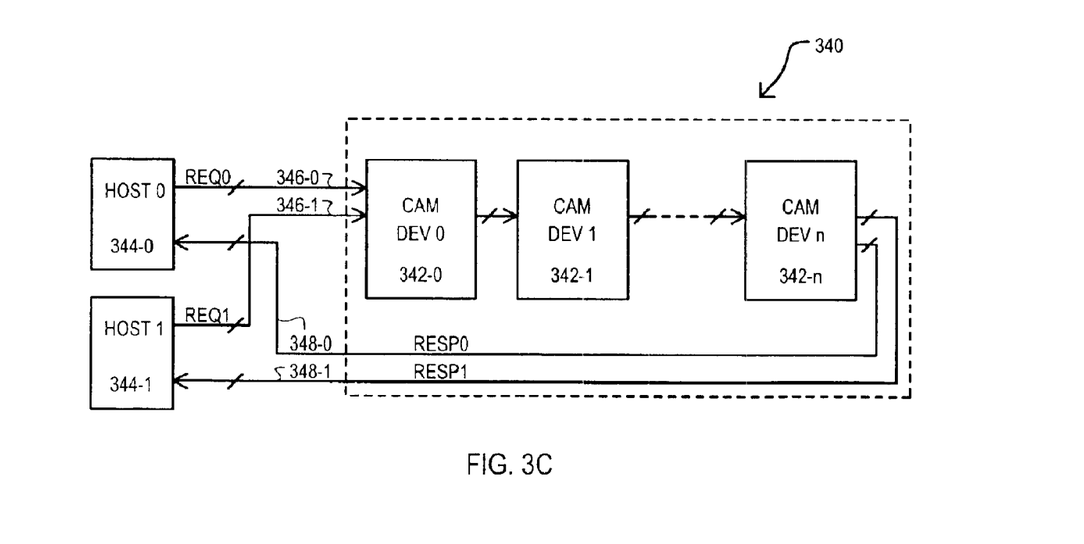
FIG. 3C is a block diagram of a first system topology according to one embodiment of the present invention.

Referring now to FIG. 3C, a system topology according to one embodiment is set forth in a block diagram and designated by the general reference number 340. A system 340 may include a number of CAM devices 342-0 to 342-n, at least two requesting devices 344-0 and 344-1, a number of input communication links 346-0 and 346-1, and a number of output communication links 348-0 and 348-1.

CAM devices 342-0 to 342-n may include at least one ingress CAM device and at least one egress CAM device. In the arrangement shown in FIG. 3C, a first CAM device 342-0 may be an ingress CAM device. Such an ingress CAM device may have a configuration like that shown in FIG. 3A. A last CAM device 342-n in a cascaded CAM system may be an "egress" CAM device. Such an egress CAM device may have a configuration like that shown in FIG. 3B.

An example of the operation of a system 340 will now be described with reference to FIG. 3C. A requesting device 344-0 may generate a request REQ0 for execution by a system 340. Such a request may be received on input communication link 346-0. In a similar fashion, a requesting device 344-1 may generate a request REQ1 that may be received on input communication link 346-1. Ingress CAM device 342-0 may select one of the requests (REQ0 or REQ1) according to predetermined criteria. It is assumed that request REQ1 is selected before request REQ0.

Request REQ1 may be applied to CAM core circuits within ingress CAM device 342-0 to generate an initial response. In addition, the same request REQ1 may propagate through a system 340 to subsequent CAM devices (e.g., 342-1 to 342-n). In response to request REQ1, an ingress CAM device 342-0 may generate response data. In addition, an ingress CAM device 342-0 can also generate a flow ID value. As noted above, such a flow ID value may be based on input communication link 346-1 upon which a corresponding request was received. An ingress CAM device 342-0 may then output response data and a corresponding flow ID value to a next CAM device 342-1 in cascade.

A next CAM device 342-1 can generate its own response data in response to request REQ1. A next CAM device 342-1 can then output response data based on response data received from ingress CAM device 342-0 and its own generated response data. Resulting response data may then be output to a next CAM device (not shown) along with the flow ID generated by ingress CAM device 342-0.

An egress CAM device 342-n may receive resulting response data along with a flow ID generated by ingress CAM device 342-0. Egress CAM device 342-n may generate an output response based on such received response data along with its own response data generated from request REQ1. However, rather than output such response data along with a flow ID value, an egress CAM device 342-n may output response data on a particular output communication link 348-0 and 348-1. Thus, in the example described, egress CAM device 342-n can output a response RESP1 (corresponding to request REQ1) on output communication link 348-1. In this way, response data may be transmitted to an appropriate requesting device.

From the above, it follows that an ingress CAM device 342-0 may input request REQ0 after request REQ1. Such a request may then propagate through CAM devices 342-0 to 342-n and generate response data. Also, ingress CAM device 342-0 can generate a flow ID value, corresponding to input communication link 346-0, that can be output along with a response generated in response to request REQ0. Of course, CAM devices 342-0 to 342-n may execute such requests in a pipelined fashion. An egress CAM device 342-n may output a response RESP0 according to a flow ID value on output communication link 348-0.

Figure 3D:
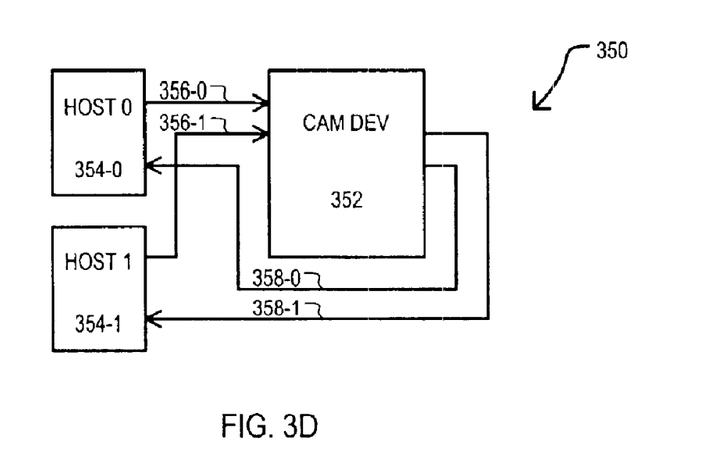
FIG. 3D is a block diagram of a second system topology according to one embodiment of the present invention.

Referring now to FIG. 3D, a system topology according to another embodiment of the present invention is set forth and designated by the general reference number 350. A system 350 may include a CAM device 352, at least two requesting devices 354-0 and 354-1, input communication links 356-0 and 356-1, and output communication links 358-0 and 358-1.

In FIG. 3D, a single CAM device 352 may receive requests on multiple input communication links 356-0 and 356-1. Further, a same CAM device 352 may provide responses on output communication links 358-0 and 358-1. Thus, FIG. 3D shows an arrangement in which a single CAM device 352 may be both an ingress and an egress CAM device.

Having described various CAM system arrangements that may receive requests and generate responses, particular examples of request and response packets are set forth.

Figure 4A:
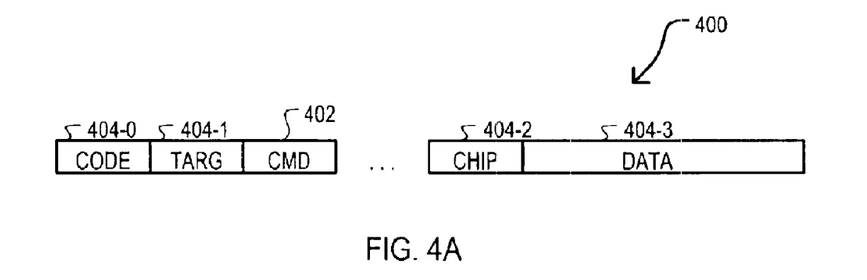
FIG. 4A is a block diagram of a request according to one embodiment of the present invention.

Referring now to FIG. 4A, a request according to one embodiment is set forth and designated by the general reference number 400. A request 400 may be in data packet form and include a number of data fields, each of which can store a predetermined data value.

As shown in FIG. 4A, a request 400 may include a command field 402, at least a portion of which may describe a command for execution in response to a request.

In the very particular example of FIG. 4A, a request 400 may further include a code field 404-0 that may indicate a packet start and/or size, a target field 404-1 that may direct a request to a particular portion of a CAM device (e.g., a block or quadrant of entries), a device field 404-2 that may indicate one or more devices for which a request is intended, and a data field 404-3 that may store data associated with a request.

Figure 4B:
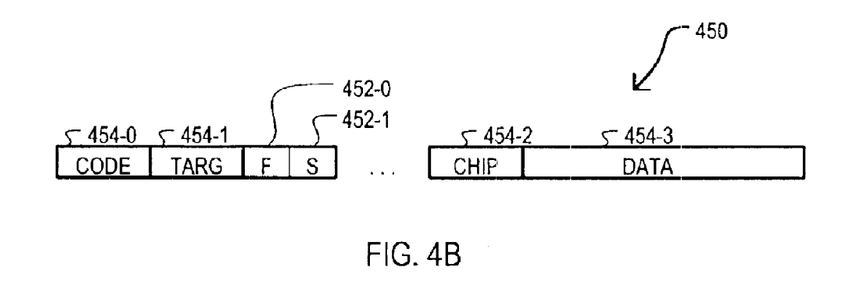
FIG. 4B is a block diagram of a response according to one embodiment of the present invention.

Referring now to FIG. 4B, a response according to one embodiment is set forth and designated by the general reference number 450. Like the request 400 shown in FIG. 4A, a response 450 may be in data packet form and include a number of data fields, each of which can store a predetermined data value.

As shown in FIG. 4B, a response 450 may include a flow field 452-0 and a status field 452-1. A flow field 452-0 may store a flow ID value, like that noted above. A status field 452-1 can indicate a status value for a response. A status value can indicate if a response represents a successful execution of a corresponding request. Further, a status value can indicate how multiple responses can be combined to generate a single response.

In the very particular example of FIG. 4B, a response 450 may further include a code field 454-0 that may indicate a packet start and/or size, a target field 454-1 that may identify a packet as a response packet, a device field 454-2, and a data field 454-3. A device field 454-2 may indicate a device with which a response is associated. A data field 454-3 may store data associated with a response.

Examples of an ingress circuit for a CAM device will now be described in detail with reference to FIGS. 5A and 5B.

Figure 5A:
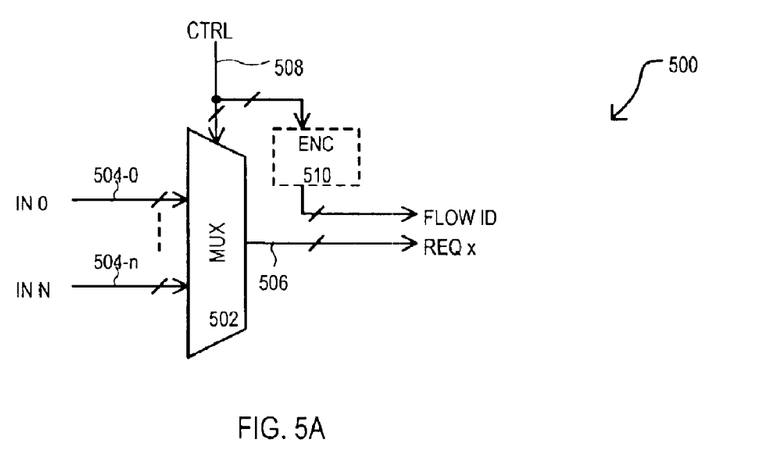
FIG. 5A is a block diagram of an ingress circuit according to one embodiment of the present invention.

Referring now to FIG. 5A, a first example of an ingress circuit is set forth in a block schematic diagram, and designated by the general reference character 500. An ingress circuit 500 may include an ingress MUX 502.

A MUX 502 may include a number of MUX inputs 504-0 to 504-n and a MUX output 506. Preferably each MUX input (504-0 to 504-n) may receive requests from a different requesting device or process. According to control signals CTRL, a MUX 502 can input request data from a MUX input (504-0 to 504-n). Control signals CTRL may be received at a control signal input 508.

In particular embodiments, control signals CTRL may be essentially the same as a flow ID value. In other particular embodiments, control signals CTRL may indirectly generate a flow ID value. For example, as shown in FIG. 5A, an ingress circuit 500 may optionally include an encoder 510. An encoder 510 can encode control signal combinations into particular flow ID values.

Control signals CTRL may be generated according to various methods. For example, if request data is received at MUX inputs (504-0 to 504-n) at essentially the same rate, control signals may be "polling" signals that sequence through MUX inputs (504-0 to 504-n), periodically connecting each to MUX output 506.

Alternatively, a control signals CTRL may vary according to a request traffic flow. One example of such an arrangement is shown in FIG. 5B.

Figure 5B:
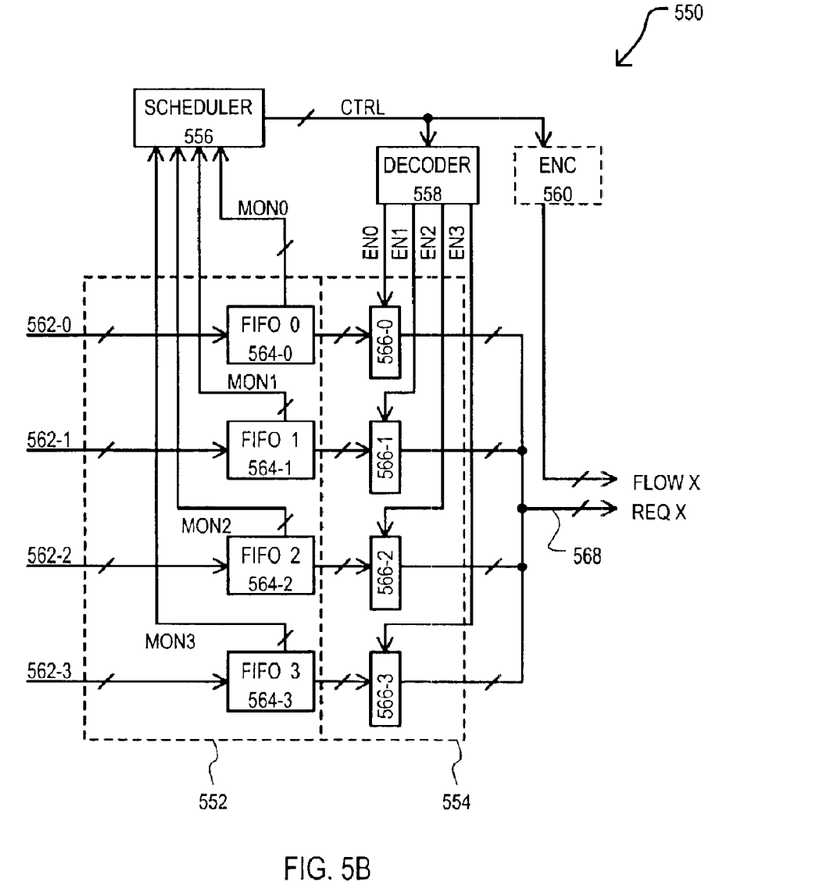
FIG. 5B is a block diagram of an ingress circuit according to another embodiment of the present invention.

Referring now to FIG. 5B, a second example of an ingress circuit is set forth and designated by the general reference number 550. An ingress circuit 550 may include a first-in-first-out memory device (FIFO) portion 552, a MUX 554, a scheduler 556, and a control signal decoder 558. An ingress circuit 550 may optionally include an encoder 560.

A FIFO portion 552 may receive different request data on corresponding communication links 562-0 to 562-3. For example, request data from a first requesting device/process may be received on communication link 562-0, request data from a second requesting device/process may be received on communication link 562-1, request data from a third requesting device/process may be received on communication link 562-2, etc.

In FIG. 5B, a FIFO portion 552 may include a FIFO circuit 564-0 to 564-3 corresponding to each communication link (562-0 to 562-3). Each FIFO circuit (562-0 to 562-3) can receive and output data in a first-in-first-out fashion. Further, each FIFO circuit (562-0 to 562-3) can provide an output signal MON0 to MON3 that can represent the amount of request data stored in a FIFO circuit (562-0 to 562-3). FIFO circuits (562-0 to 562-3) can have outputs connected to a corresponding input of a MUX 554.

In the particular example of FIG. 5B, a MUX 554 may include a number of gates 566-0 to 566-3, each corresponding to a particular input of MUX 554. Each gate (566-0 to 566-3) may be enabled by a corresponding enable signal EN0 to EN3 provided by a control decoder 558. Outputs of gates (566-0 to 566-3) may be commonly connected to a MUX output 568.

A scheduler 556 may generate control signals based on monitor signals MON0 to MON3 provided by FIFO circuits (564-0 to 564-3). In one particular embodiment, a scheduler 556 may activate a selected enable signal according to traffic received at a corresponding FIFO circuit (564-0 to 564-3). For example, a scheduler 556 may determine from monitor signals MON0 that FIFO circuit 564-0 should be selected based on received traffic. Accordingly, a scheduler 556 may generate control signals that are decoded by control signal decoder 558 to enable signal EN0. This can allow request data from FIFO circuit 564-0 to be output on MUX output 568.

A scheduler 556 may activate selected enable signals according to predetermined traffic conditions. As but one example, a scheduler 556 may enable a gate (566-0 to 566-3) according to which corresponding FIFO circuit (564-0 to 564-3) stores the most request data (i.e., a fullest FIFO circuit). As another example, a scheduler 556 may preset a storage limit for each FIFO circuit (564-0 to 564-3). Once a limit is exceeded, request data in a corresponding FIFO (564-0 to 564-3) may be selected for output on MUX output 568. Of course, various other methods could be employed to select a particular FIFO circuit (564-0 to 564-3).

A control signal decoder 558 may decode control signals CTRL output from a scheduler 556. In one arrangement, a control signal decoder 558 can activate a single enable signal (EN0 to EN3) in response to different combinations of control signals CTRL.

Like the ingress circuit 500 shown in FIG. 5A, an ingress circuit 550 may optionally include an encoder 560. An encoder 560 can encode control signals CTRL into particular flow ID values.

An ingress circuit 550 may be conceptualized as receiving multiple parallel requests at one speed and outputting requests at a higher speed than the one speed. In particular embodiments, an average processing speed of a CAM device may exceed a request issuing speed of one or more host devices. A MUX 554 may select request data according to control signals CTRL generated by a scheduler 556. Multiple parallel request data temporarily stored in a FIFO portion 552 may then be selected according to a particular criterion and output in a serial fashion at a higher speed.

Figure 6A:
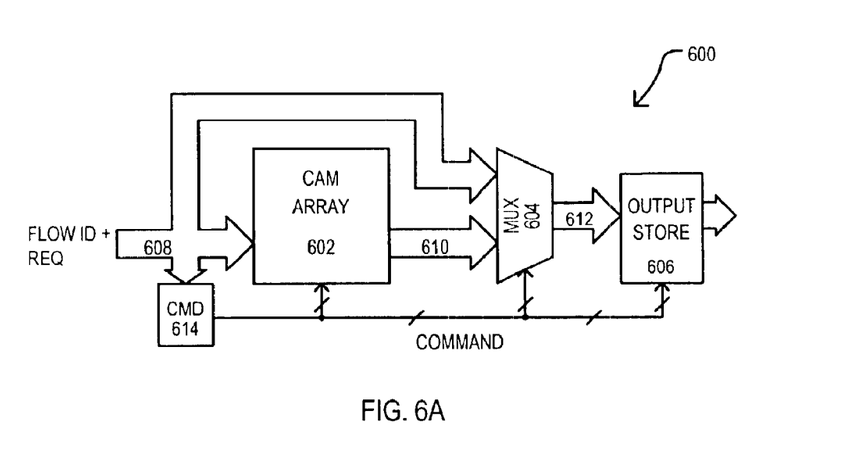
FIG. 6A is a block diagram of a CAM core according to one embodiment of the present invention.

Referring now to FIG. 6A, a first example of a CAM core according to one embodiment is set forth and designated by the general reference number 600. A CAM core 600 may include a CAM array 602, a select MUX 604, an output store 606, an input data path 608, a result output data path 610, a MUX output data path 612, and a command decoder 614.

An input data path 608 may input data values to both a CAM array 602 and a select MUX 604. A result output data path 610 may output data from a select MUX 604 to an output store 606.

A CAM array 602 may include conventional CAM entries and associated control and data registers for executing CAM operations, such as those noted above.

A select MUX 604 may receive data from an input data path 608 and a result output path 610, and output such data according to command signals COMMAND generated by a command decoder 614.

An output store 606 may store data output from a select MUX 604. In particular, data for multiple flows may be accumulated within an output store 606 prior to being demultiplexed and output along parallel communication links. Preferably, data within an output store 606 can be read, and "packetized" for transmission in data packet form.

An input data path 608 may receive request data and a flow ID value. In the event a CAM core 600 is included in a CAM device that follows a previous CAM device in a cascade, an input data path 608 may also receive response data from such a previous CAM device.

A result output data path 610 can provide result data to an input of a select MUX 604. Result data may include data generated by a CAM array 602 in response to a particular request.

A MUX output data path 612 can provide selected output data to an output store 606. Such output data can include, without limitation, a request that is propagating through a CAM core 600, a response generated by CAM array 602, a response received from a previous CAM device in a cascaded configuration, or a combination of the latter two.

A command decoder 614 may receive command information from a request received on an input data path 608. As but one example, command information may be included in a predetermined request packet field. In response to command information, a command decoder 614 can activate command signals COMMAND for controlling the operation of a CAM array 602, select MUX 604 and/or output store 606.

Having described the general components of a CAM core 600, a processing of a request with a flow ID value will now be described.

A CAM core 600 may receive a request and flow ID value on an input data path 608. Request data may be applied to a CAM array 602, while command information may be provided to a command decoder 614. A flow ID value may be provided to a select MUX 604. In response to command information COMMAND, a select MUX 604 may output a flow ID value to a predetermined location within an output store 606. Preferably, such a location may be one portion of an output store 606 that may also store response data.

In particular arrangements, a select MUX 604 may also output a received request to an output store 606. Such a stored request may then be output to a subsequent CAM device in a cascaded arrangement.

In response to command information, a command decoder 614 can activate command signals COMMAND to enable a CAM array 602 to execute a CAM operation. Once result data is generated, command signals COMMAND can be generated that enable select MUX 604 to output such result data to output store 606. In this way, result data and a flow ID value may both be stored in output store 606.

Figure 6B:
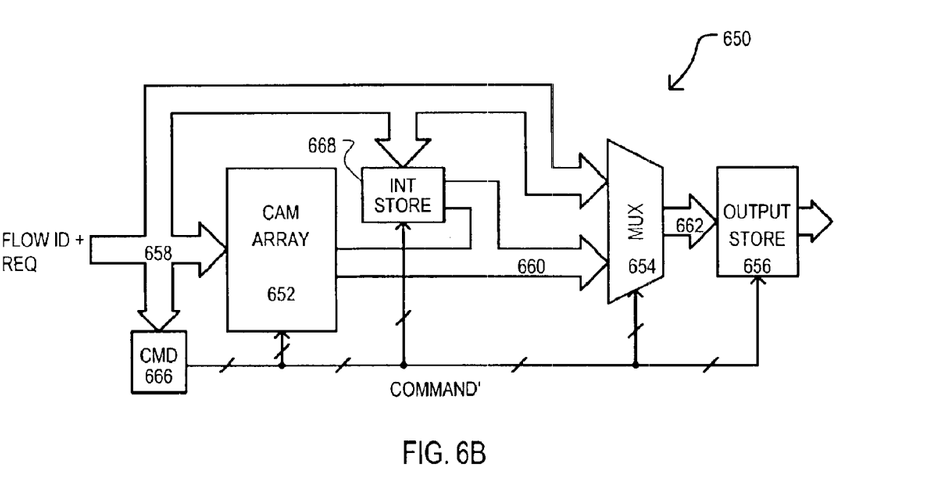
FIG. 6B is a block diagram of a CAM core according to another embodiment.

Referring now to FIG. 6B, a second example of a CAM core according to one embodiment is set forth and designated by the reference number 650. A CAM core 650 may include many of the same general components as that of FIG. 6A, including a CAM array 652, a select MUX 654, an output store 656, an input data path 658, a result output data path 660, and a MUX output data path 662. A CAM core 650 may also include a command decoder 666 and an intermediate store 668.

A command decoder 666, unlike that of FIG. 6A, can provide command signals COMMAND' to an intermediate store 668 in addition to a CAM array 652, select MUX 654, and output store 656.

An intermediate store 668 may store predetermined values, such as a flow ID value, for output along with result data.

Having described the general components of a CAM core 650, a processing of a request with a flow ID value will now be described.

A CAM core 650 may receive a request and flow ID value on an input data path 658. Like the example of FIG. 6A, request data may be applied to a CAM array 652 while command information may be provided to a command decoder 666. Unlike the case of FIG. 5A, a flow ID value may be provided to an intermediate store 668.

In response to command information, a command decoder 666 can active command signals COMMAND' to enable a CAM array 652 to execute a CAM operation. Once result data is generated, command signals COMMAND' can be generated that enable select MUX 654 to output such result data along with a flow ID value in intermediate store 668. In this way, result data and a flow ID value may both be stored in output store 656.

Of course, FIGS. 6A and 6B represent very particular embodiments, and should not be construed as limiting the invention thereto.

Figure 7:
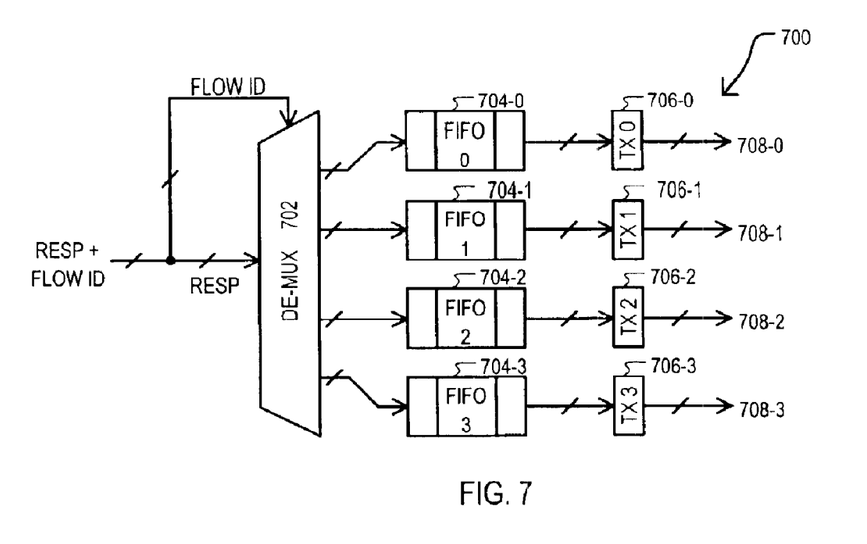
FIG. 7 is a block diagram of an egress de-multiplexer circuit according to one embodiment of the present invention.

Referring now to FIG. 7, an egress de-multiplexer DE-MUX circuit according to one embodiment is set forth and designated by a general reference number 700. An egress de-multiplexer DE-MUX circuit 700 may include an egress de-multiplexer (DE-MUX) 702, a number of output first-in-first-out memory (FIFO) circuits 704-0 to 704-3, a number of transmitters (TX0–TX3) 706-0 to 706-3, and a number of communication links 708-0 to 708-3.

An egress DE-MUX 702 may receive a response as input data and a corresponding flow ID value as control data. An egress de-multiplexer DE-MUX 702 may then output response data to a selected output FIFO circuit (704-0 to 704-3) according to a flow ID value.

Output FIFO circuits (704-0 to 704-3) can buffer outgoing responses. In the arrangement of FIG. 7, each output FIFO circuit (704-0 to 704-3) can buffer response data for a corresponding communication link (708-0 to 708-3).

Transmitters (706-0 to 706-3) may transmit response data provided by corresponding output FIFO circuits (704-0 to 704-3) on a communication link 708.

In particular arrangements, a processing speed of a CAM device may exceed a response processing speed of a requesting devices. An egress DE-MUX circuit 700 may translate serial responses at one speed to multiple parallel responses at a speed slower than the one speed according to their flow ID values.

While the embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A content addressable memory (CAM) device, comprising:

at least one CAM array having a plurality of CAM entries; and a flow identification (ID) generating circuit that generates a flow ID value for a response resulting from a corresponding request, each flow ID value corresponding to an input from which the corresponding request is received.

2. The CAM device of claim 1, wherein:

the CAM device includes a plurality of input communication links, each input communication link receiving requests from a different requesting source.

3. The CAM device of claim 2, further including:

a multiplexer that inputs a request from one of a plurality of input communication links.

4. The CAM device of claim 3, wherein:

the multiplexer inputs a request according to control signals that correspond to flow ID values.

5. The CAM device of claim 1, further including:

a de-multiplexer that outputs a response on one of a plurality of communication links according to the flow ID value for the response.

6. The CAM device of claim 1, further including:

a scheduler that generates control signals for inputting request data on one of a plurality of inputs; and wherein each flow ID values is generated in response to the control signals.

7. The CAM device of claim 6, further including:

a plurality of first-in-first-out (FIFO) buffer circuits, each coupled to a different input and receiving requests from a different request source and providing status data corresponding to the amount of data in the FIFO buffer circuit to the scheduler.

8. A content addressable memory (CAM) device, comprising:

at least one CAM array;

a de-multiplexer that outputs a response on one of a plurality of output communication links according to at least one flow identification (ID) value associated with the response; and an input multiplexer that provides a data path between one of a plurality of input communication links and a first data path according to control signals.

9. The CAM device of claim 8, further including:

a flow ID value generating circuit that generates flow ID values for responses based on an input communication link on which a corresponding request is received.

10. The CAM device of claim 8, further including:

a select multiplexer having one input coupled to an input data path and another input coupler to the CAM array.

11. The CAM device of claim 10, further including:

an output store, coupled to an output of the select multiplexer, for storing flow ID values and responses.

12. The CAM device of claim 10, further including:

an intermediate store for storing flow ID values, the intermediate store being coupled to an input of the select multiplexer.

13. The CAM device of claim 8, further including:

a plurality of first-in-first-out (FIFO) buffer circuits, each coupled between an output of the de-multiplexer and one of the output communication links.

14. The CAM device of claim 8, further including:

an input multiplexer that provides a data path between one of a plurality of input communications links and a first data path according to control signals.

15. A method of executing requests in a CAM system, comprising the steps of:

a receiving requests from multiple different sources on input communication links; and assigning a flow identification (ID) value to a response that corresponds to the input communication link on which a request that generates the response was received.

16. The method of claim 15, further including the step:

generating responses corresponding to the requests within at least one CAM device.

17. The method of claim 16, wherein:
the requests are selected from the group consisting of: search operation, read operation, write operation, learn operation, and parity check operations.

18. The method of claim 15, further including the steps:
storing the flow ID value; and
outputting the flow ID value with response data to an output store.

19. The method of claim 15, further including the steps:
storing the flow ID value in a first portion of an output store; and
subsequently outputting response data to a second portion of the output store.

20. A content addressable memory (CAM), comprising:
at least one communication link; and
the CAM configured to include flow information to an incoming command corresponding to the link on which the command was received.

* * * * *